(12) United States Patent
Jeoung et al.

(10) Patent No.: US 7,479,415 B2
(45) Date of Patent: Jan. 20, 2009

(54) FABRICATION METHOD OF POLYCRYSTALLINE SILICON LIQUID CRYSTAL DISPLAY DEVICE

(75) Inventors: Hun Jeoung, Gyungsangbuk-Do (KR); Chang-Jae Jang, Busan (KR)

(73) Assignee: LG. Display Co., Ltd., Seoul (KR)

( * ) Notice: Subject to any disclaimer, the term of this patent is extended or adjusted under 35 U.S.C. 154(b) by 461 days.

(21) Appl. No.: 11/005,646

(22) Filed: Dec. 6, 2004

(65) Prior Publication Data

US 2005/0242352 A1 Nov. 3, 2005

(30) Foreign Application Priority Data

Apr. 29, 2004 (KR) .................. 10-2004-0030193

(51) Int. Cl.
*H01L 21/00* (2006.01)

(52) U.S. Cl. ............ 438/149; 438/151; 438/300; 438/586; 257/57; 257/59; 257/66; 257/E21.413; 257/E21.703; 257/E21.59

(58) Field of Classification Search .......... 438/151, 438/300, 149, 586, 700, 597; 427/376.2; 349/43, 47; 345/92; 257/57, E21.413, E21.703, 257/E21.59
See application file for complete search history.

(56) References Cited

U.S. PATENT DOCUMENTS

| | | | |
|---|---|---|---|
| 5,317,432 A * | 5/1994 | Ino .................. 349/39 |
| 5,852,481 A * | 12/1998 | Hwang ................ 349/43 |
| 5,918,110 A * | 6/1999 | Abraham-Fuchs et al. ... 438/48 |
| 6,207,481 B1 * | 3/2001 | Yi et al. ............... 438/166 |
| 6,549,252 B1 * | 4/2003 | Lee et al. ............. 349/47 |
| 6,627,471 B2 * | 9/2003 | Yang ................. 438/30 |
| 6,963,382 B1 * | 11/2005 | Yamazaki et al. ....... 349/141 |
| 7,125,757 B2 * | 10/2006 | Hwang et al. ......... 438/151 |
| 2002/0001047 A1 * | 1/2002 | Park et al. ............ 349/43 |
| 2002/0027543 A1 * | 3/2002 | Koyama et al. ........ 345/92 |
| 2002/0177283 A1 * | 11/2002 | Hwang et al. ......... 438/300 |
| 2003/0007108 A1 * | 1/2003 | Hwang et al. ......... 349/43 |
| 2003/0151049 A1 * | 8/2003 | Hotta et al. ........... 257/59 |
| 2003/0170433 A1 * | 9/2003 | Hasegawa et al. ...... 428/209 |
| 2003/0209726 A1 * | 11/2003 | Shigeno .............. 257/200 |
| 2003/0219540 A1 * | 11/2003 | Law et al. ............ 427/376.2 |
| 2004/0135143 A1 * | 7/2004 | Harano et al. ......... 257/57 |
| 2005/0242352 A1 * | 11/2005 | Jeoung et al. ......... 257/66 |

* cited by examiner

*Primary Examiner*—Zandra V. Smith
*Assistant Examiner*—Latanya Crawford
(74) *Attorney, Agent, or Firm*—Brinks Hofer Gilson & Lione

(57) ABSTRACT

A method for fabricating a polysilicon silicon liquid crystal display device is disclosed in which a contact hole connecting source and drain electrodes to an active layer is formed without a stepped portion. An insulation layer containing a porous silicon nitride layer is formed. Wet etching the contact hole through the porous silicon nitride layer and an underlying silicon oxide layer does not generate the stepped portion as the etch rates of the porous silicon nitride layer and the silicon oxide layer are the same. Because the stepped portion is not generated at a contact hole, disconnection of source and drain electrodes formed in the contact hole is prevented, thereby preventing deterioration of the liquid crystal display device from occurring.

4 Claims, 6 Drawing Sheets

FABRICATION METHOD OF POLYCRYSTALLINE SILICON LIQUID CRYSTAL DISPLAY DEVICE

This application claims the benefit of priority to Korean Patent Application No.: 30193/2004, filed on Apr. 29, 2004, which is incorporated herein by reference in its entirety.

BACKGROUND

1. Field

The present invention relates to a fabrication method of a liquid crystal display device (LCD), and particularly, to a method for forming a contact hole connecting source and drain electrodes and an active layer of a thin film transistor (TFT).

2. Description of the Related Art

A liquid crystal display panel includes TFT array layer, color filter layer corresponding to the TFT array layer and liquid crystal layer therebetween. The TFT array layer includes a plurality of unit pixels arranged in a matrix form and the color filter substrate includes color filter layer to display information as color.

The unit pixels on the TFT array substrate are defined by a plurality of gate lines and a plurality of data lines which perpendicularly intersect with the gate lines, and a TFT for driving the unit pixel is formed at an intersection of the gate line and the data line.

While an amorphous silicon TFT including an active layer made of amorphous silicon has been primarily used in LCDs, other types of TFTs are currently being investigated. One such type of TFT under development is a polycrystalline silicon (polysilicon) TFT including an active layer made of polysilicon and having an operation characteristic that is better than the TFT having an active layer made of amorphous silicon layer.

A structure of a polysilicon TFT will now be described with reference to FIG. 1. The polysilicon TFT includes a buffer layer 2, a silicon oxide ($SiO_2$) layer formed on a transparent substrate 1 such as glass, plastic or the like, and an active layer 3 made of polysilicon and formed on the buffer layer 2. A first insulation layer 4 for insulating the polysilicon layer is formed on the polysilicon active layer 3.

A gate electrode 5 is formed on the first insulation layer 4, and a second insulation layer 6 is formed on the gate electrode 5. The second insulation layer 6 is a silicon oxide ($SiO_2$) layer and insulates source and drain electrodes 7 and 8 to be formed on the second insulation layer 6 from the gate electrode 5. A source electrode 7 and a drain electrode 8 for applying a data signal to a pixel electrode 10 are formed on the second insulation layer 6. The source and drain electrodes 7 and 8 are connected to the active layer 3 through contact holes 20 through the first insulation layer 4 and the second insulation layer 6.

In addition, a passivation layer 9 is formed on the source and drain electrodes 7, 8 so as to protect the TFT formed under the passivation layer 9 and flatten the liquid crystal display device in which the TFT is fabricated. A contact hole 30 for connecting the drain electrode 8 and the pixel electrode 10 to each other is formed at the passivation layer 9, and the pixel electrode 10 is connected to the drain electrode 8 through the contact hole 30.

Hereinafter, a process for forming a contact hole 20 connecting the source and drain electrode 7 and 8 to the active layer 3 will now be described in detail with reference to FIG. 2.

A second insulation layer 6 is formed on a gate electrode 5, and then a photoresist layer 11 is formed on the second insulation layer 6. When the photoresist layer 11 is exposed and developed by using a mask, a contact hole pattern is formed as shown in FIG. 2. Wet-etching is performed using the photoresist layer 11 including the contact hole pattern as a mask, thereby etching the second insulation layer 6 and then the first insulation layer 4.

Because wet-etching is isotropic, the second insulation layer 6 may be excessively etched under the photoresist pattern, and this etched-away portion is called undercut. Undercutting leads to a contact hole that does not satisfy a desired design rule, and thus the source and drain electrodes are formed to be larger than the desired design rule. In addition, undercutting causes a stepped contact hole 20 to be formed as shown by the first insulation layer 4 and the second insulation layer 6 in FIG. 2. If a metal thin layer for source/drain electrodes is deposited in the stepped contact hole 20 described above, the formed thin layer may be disconnected.

Thus, forming a contact hole by wet-etching does not permit satisfaction of a desired design rule, and undercut occurs. In order to solve such problems, techniques using silicon nitride layer as a second insulation layer have been introduced. In this method, the first and second insulation layers are etched by dry-etching.

However, while a silicon nitride layer is able to be dry-etched easily, a silicon oxide layer is not. This means that, as the first insulation layer 4 is etched, the photoresist layer used as a mask is hardened and thus is not easily removed in a stripping process subsequent to the etching process. Thus, photoresist residue remains as a foreign substance. The photoresist residue causes various connection problems between the TFT and other circuitry in the LCD.

In addition, because the etching speed of the second insulation layer 6 is different from that of the first insulation layer 4, undercut of the first insulation layer 4 occurs when the first insulation layer is etched, and thus a stepped portion is again generated in the contact hole. When source and drain electrodes are formed using the contact holes having a stepped portion, connection problems between the source and drain electrodes and the TFT may occur.

BRIEF SUMMARY

A polysilicion liquid crystal display device and method for fabricating the same is provided. An active layer is formed on a substrate. A first insulation layer is formed on the active layer. A gate electrode is formed on the first insulation layer. A second insulation layer is formed on the gate electrode. A contact hole that exposes the active layer is formed in the second insulation layer. Source and drain electrodes are connected to the active layer through the contact hole. A pixel electrode is connected to the drain electrode.

The second insulation layer may contain porous silicon nitride in a single or multiple layer structure. The first insulation layer, as well as one of the layers of a multiple second insulation layer, may contain silicon oxide. The liquid crystal display device may be a transparent device, in which a backlight is used to illuminate the display, a reflective device in which ambient light is used to illuminate the display, or a transflective device in which the backlight and ambient light are used to illuminate the display. In the transflective device, a pixel electrode contains both a reflective electrode formed in a reflective region and a transparent electrode formed in a transparent region. The reflective electrode contains a reflective material that coats a passivation layer above the active layer, thereby protecting the active layer from external light.

The transparent electrode contains a transparent material that partially overlaps the reflective electrode, and is formed under a portion of the passivation layer.

BRIEF DESCRIPTION OF THE DRAWINGS

The accompanying drawings, which are included to provide a further understanding of the invention and are incorporated in and constitute a unit of this specification, illustrate embodiments of the invention and together with the description serve to explain the principles of the invention.

In the drawings.

DETAILED DESCRIPTION

Reference will now be made in detail to embodiments of the present invention, examples of which are illustrated in the accompanying drawings.

A fabrication method of a liquid crystal display device in accordance with the present invention prevents connection problems between the source and drain electrodes and the semiconductor due to a stepped portion in the contact hole by minimizing or eliminating the stepped portion.

Hereinafter, a fabrication method of a liquid crystal display device in accordance with a first embodiment of the present invention will now be described with reference to FIGS. 3A to 3F.

Figure 1:
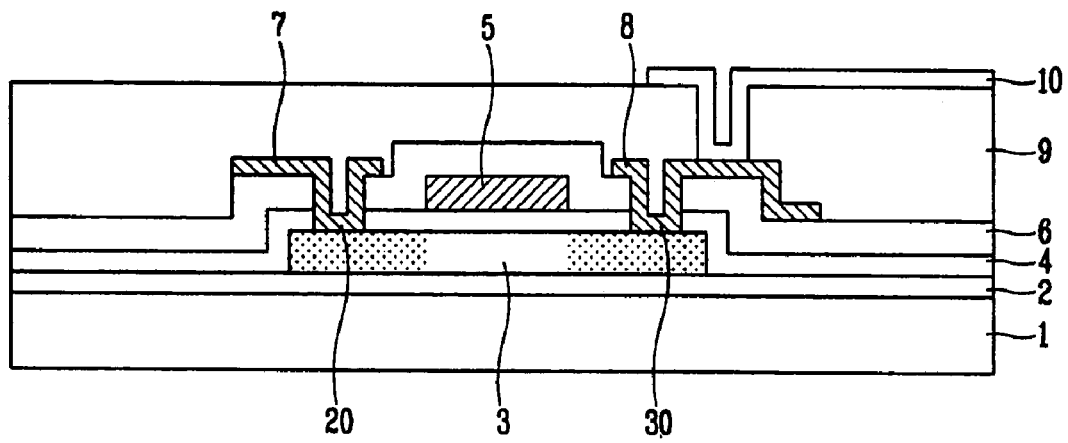
FIG. 1 is a sectional view showing a structure of a general polysilicon thin film transistor.
Figure 2:
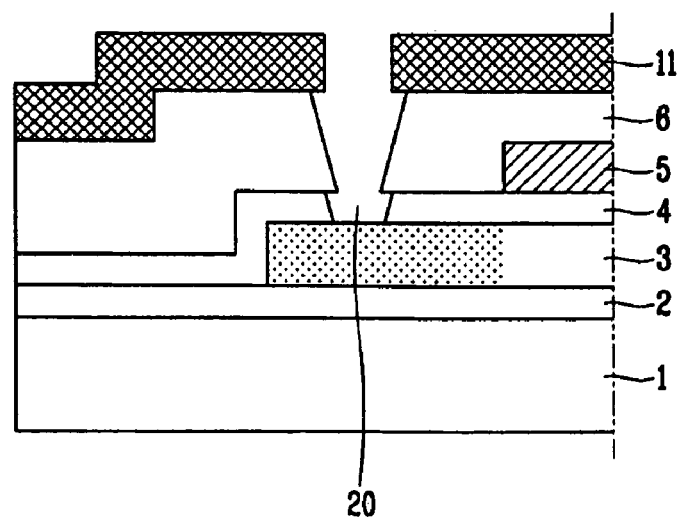
FIG. 2 is a sectional view showing a structure of a contact hole portion formed on a general active layer.
Figure 3A:
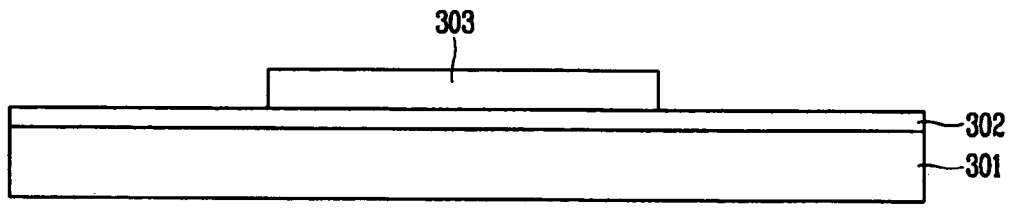
FIGS. 3A to 3F are views showing a fabrication process of a polysilicon thin film transistor in accordance with the present invention.
Figure 3B:
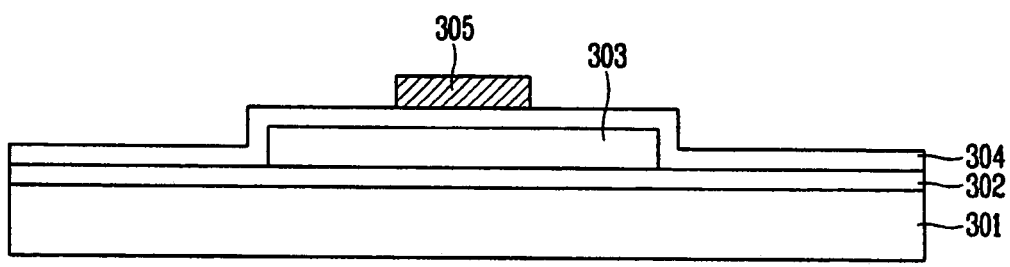
Figure 3C:
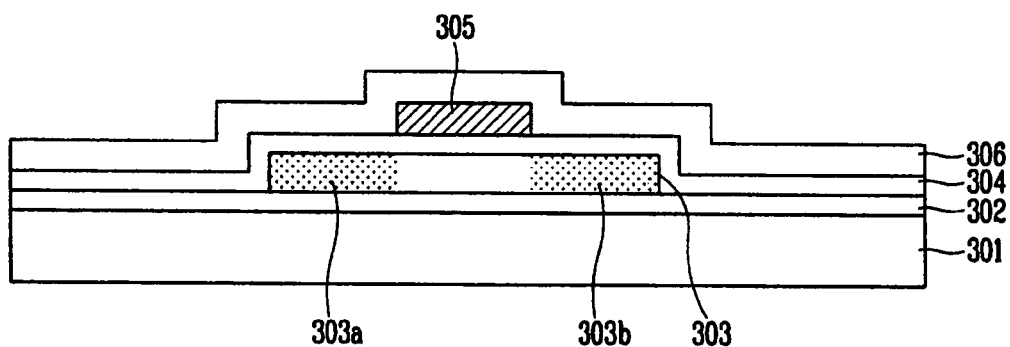

As shown in FIG. 3A, a buffer layer 302 is formed on a transparent substrate 301 by plasma enhanced chemical vapor deposition (PECVD). The buffer layer 302 is formed of, for example, silicon oxide ($SiO_2$). After the buffer layer 302 is formed, an amorphous silicon layer is deposited onto the buffer layer 302 by PECVD. Then, the amorphous silicon layer is crystallized. The buffer layer 302 prevents diffusion of impurities present in the substrate 301 to an active layer during crystallization of the amorphous silicon.

Furnace annealing and/or laser annealing may be used to crystallize the amorphous silicon layer. In furnace annealing, the amorphous silicon layer is crystallized by placing the amorphous silicon layer in a furnace of high temperature for a predetermined amount of time. Using laser annealing, the amorphous silicon layer is crystallized using a laser that generates a high temperature in the amorphous silicon layer for a short period of time.

After the amorphous silicon layer is crystallized by one of the above-described methods, the crystallized amorphous silicon layer is patterned into an active layer 303. In the patterning process, a photoresist is provided to the amorphous silicon layer. A mask is then arranged on the substrate containing the photoresist and the photoresist is then exposed through the mask. After exposure, the photoresist is developed and subsequently etched, to thereby form an active layer 303.

After active layer of crystalline silicon, for example, polysilicon is formed, a first insulation layer 304 is formed on the active layer 303. The first insulation layer 304 is a gate insulation layer formed from an inorganic material such as silicon oxide. The first insulation layer 304 electrically insulates a gate electrode formed on the active layer 303 from the active layer 303.

A gate electrode 305 is formed on the first insulation layer 304 using a photolithographic process. The gate electrode 305 contains one or more conductive layers. For example, a single layer gate electrode may contain an aluminum alloy. Similarly, a multiple layer gate electrode includes two or more layers, one of which contains an aluminum alloy and another of which contains molybdenum to improve ohmic contact with the material used to form the pixel electrode discussed below. The photolithographic process for forming the gate electrode 305 is similar to that above. A metal layer is formed on the first insulation layer 304 by sputtering. A photoresist is then applied over the metal layer and exposed using a mask. The exposed photoresist is developed to form a gate pattern. The metal layer is then etched using the photoresist pattern as a mask and the photoresist pattern subsequently removed.

After the gate electrode 305 is formed, impurities (also referred to as impurity ions) of high concentration are injected in the active layer 303 to form a source and drain region 303a, 303b using the gate electrode 305 as a blocking mask. A high concentration of impurities is injected into the active layer 303. The ions injected form the source and drain regions and also permit the source and drain electrodes to have ohmic contact with the active layer. Group 3 ions such as boron or the like may be injected into the active layer 303 in order to form a P-type thin film transistor, and group 5 ions such as phosphorus or the like may be injected into the active layer in order to form an N-type thin film transistor. Next, a second insulation layer 306 is formed on the gate electrode 305. The second insulation layer 306 contains one or more inorganic layers. For example, a single layer structure may be formed using silicon nitride, while a multiple layer structure may be formed using a silicon oxide layer and a silicon nitride layer.

Using a silicon nitride layer in the second insulation layer 306 allows the capacitance of a storage region (not shown) to be increased compared with using a structure containing solely silicon oxide as the dielectric constant of silicon nitride is greater than that of silicon oxide. This means that a multiple layer structure containing the silicon oxide layer and the silicon nitride layer can achieve a desired capacitance and insulation by controlling the thickness of the layers. In addition, considering etching speeds of a silicon nitride layer of the second insulation layer 306 and a silicon oxide layer of the first insulation layer 304, a thickness of a silicon oxide layer of the second insulation layer 306 can be controlled.

In addition, as hydrogen ions are present when the silicon nitride layer of the second insulation layer 306 is formed, the polysilicon active layer 303 may be hydrogenated by these hydrogen ions. Hydrogenation restores the active layer 303, which is damaged during formation of the active layer 303 as well as subsequent layers. In particular, hydrogenation passivates dangling bonds that are present at a surface of the active layer.

The silicon nitride layer formed by deposition using a plasma including $N_2$ gas of about 1700 sccm to 2300 sccm (sccm: standard cubic centimeters per minute), $NH_3$ gas of about 600 to 800 sccm and SiH4 gas of about 130 to 150 sccm under conditions of voltage of about 1500 to 1700 watt and pressure of about 1400 to 1600 mTorr. Particularly, the silicon nitride layer may be formed using a plasma including N₂ gas of about 2000 sccm, NH₃ gas of about 700 sccm and SiH4 gas of about 140 sccm under conditions of voltage of about 1650 watt and pressure of about 1500 mTorr.

A silicon nitride layer formed under the above conditions has a porous structure. This porous silicon nitride layer has an etch rate when wet-etched of about 10 to 15 Å per second, which is similar to or faster than about 10 Å per second, the etch rate of the silicon oxide layer. Therefore, even if a silicon nitride layer formed under such conditions and a silicon oxide layer are simultaneously etched, undercutting can be prevented at an interface between the silicon nitride layer and the silicon oxide layer, thereby preventing generation of a stepped portion in a contact hole formed through the interface between the layers.

Figure 3D:
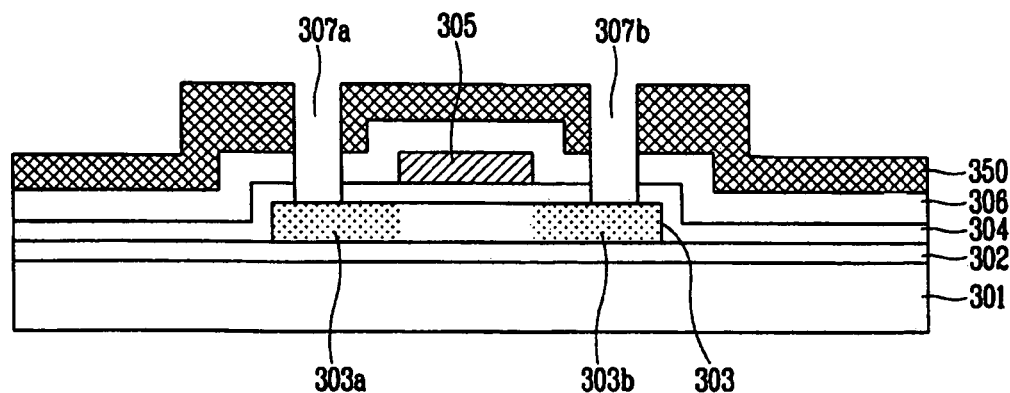

After the second insulation layer 306 is formed, as shown in FIG. 3D, contact holes 307a and 307b at the second insulation layer 306 are formed. In the present embodiment, the contact hole is formed through wet-etching. As shown in FIG. 3D, photoresist 350 is applied over the second insulation layer 306, a mask (not shown) is arranged on the photoresist, and then a photoresist pattern including a contact hole pattern is formed through exposure and development of the photoresist. After the photoresist pattern is formed, the second insulation layer 306 and the first insulation layer 304 formed on the active layer 303 are etched in turn through a wet-etching process by using the photoresist pattern as an etching mask, to thereby form contact holes 307a and 307b.

Regions of the active layer 303, where the contact holes 307a and 307b are formed are to be source and drain regions connected to source and drain electrodes. Even though the second insulation layer 306 is a silicon nitride layer, the second insulation layer 306 is wet-etched at a rate that is the same as or faster than the etch rate of the first insulation layer 304, a silicon oxide layer, because of its porous structure. Accordingly, undercutting of the second insulation layer 306 does not occur when etching is performed at boundary portions of the second insulation layer 306 and the first insulation layer 304. If the second insulation layer contains multiple layers including a silicon nitride layer and a silicon oxide layer, the silicon nitride layer and the silicon oxide layer are etched at their boundary portions at the same rate. Hence, in forming contact holes 307a and 307b, generation of a stepped portion of the first insulation layer 306 and the second insulation layer 304 due to undercutting can be prevented.

Figure 3E:
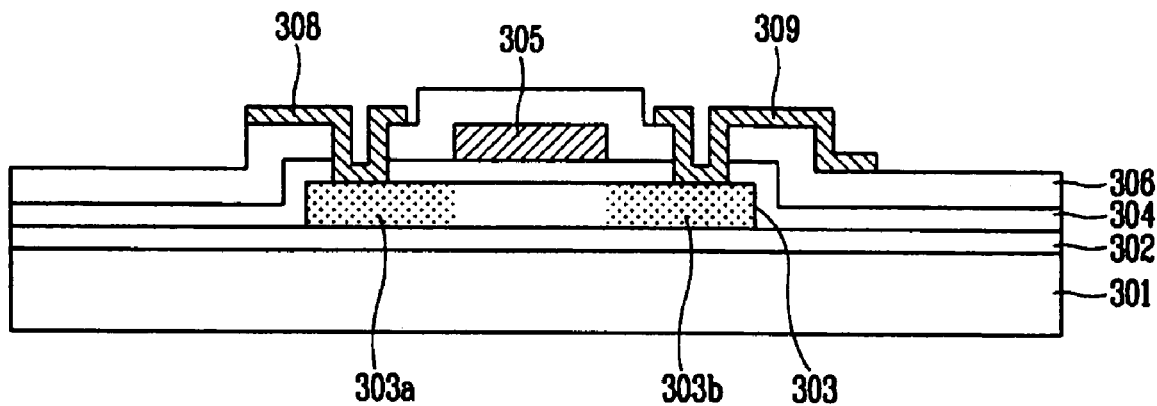

Next, as shown in FIG. 3E, the source and drain electrodes 308 and 309 are formed on the second insulation layer 306 having the contact holes 307a and 307b. In this process, a conductive layer is formed on the second insulation layer 306 and in the contact holes 307a and 307. The conductive layer is patterned through a photolithographic process, to thereby form source and drain electrodes 308 and 309.

Figure 3F:
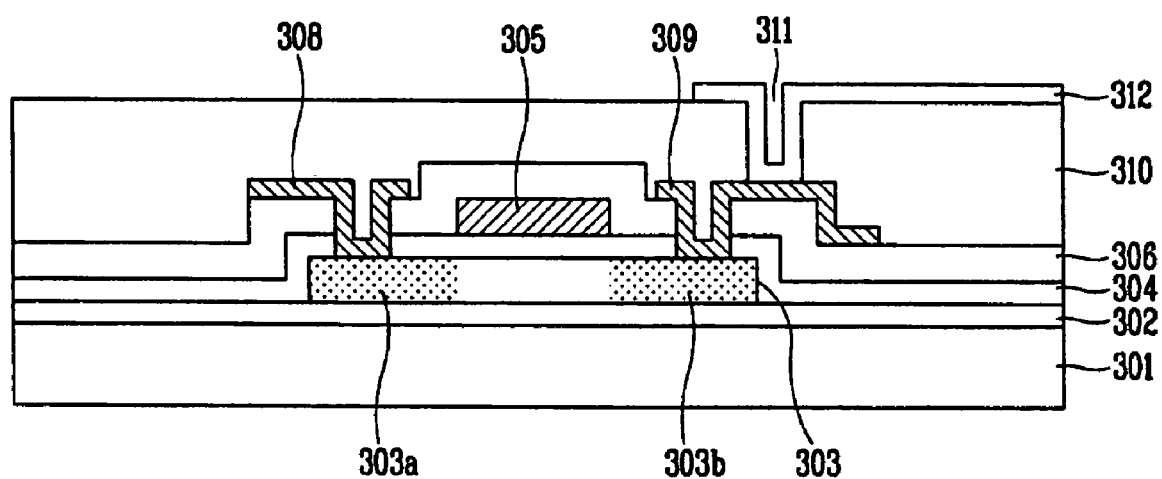

Next, as shown in FIG. 3F, a passivation layer 310 and a pixel electrode 312 are formed on the source and drain electrodes 308 and 309. In this process, a passivation layer containing an inorganic material such as silicon nitride or an organic material such as Benzocyclobutene (BCB) is formed on the source and drain electrodes 308 and 309, to thereby protect elements formed thereunder and simultaneously flatten the substrate. Next, a contact hole 311 is formed in one portion of the passivation layer 310, thereby exposing the drain electrode 309. After the contact hole 311 is formed in the passivation layer 310, a transparent material for pixel electrode, such as an indium oxide (e.g. indium tin oxide, ITO, or indium zinc oxide, IZO), is deposited onto the passivation layer 310 and then patterned through a photolithographic process, to thereby form a pixel electrode 312.

Through this process, the pixel electrode 312 is connected to the drain electrode 309 through the contact hole 311 so as to receive a data signal.

During fabrication of the above polysilicon liquid crystal display device, because a silicon oxide layer is used as a gate insulation layer, and an insulation layer including a silicon nitride layer is used as an interinsulation layer on a gate electrode, a stepped portion is prevented from being generated in a contact hole due to different etch rates between a silicon nitride layer and a silicon oxide layer in when forming a contact hole by etching the gate insulation layer and the interinsulation layer. Hence, the stepped portion formed in a contact hole in a liquid crystal display device including a gate insulation layer which is a silicon oxide layer and an interinsulation layer including a silicon nitride layer may be prevented.

A process for fabricating a transreflective liquid crystal display device according to a second embodiment of the present invention will now be described with reference to FIGS. 4A to 4E.

In a process for fabricating a transreflective liquid crystal display device according to the second embodiment of the present invention, the process for forming the buffer layer 302 on a substrate to forming a second insulation layer 306 are the same as those of the embodiment described above with reference to FIG. 3A to 3C. After a second insulation layer 306 is formed on a gate electrode 305, an indium oxide layer to be used as a pixel electrode is formed on the second insulation layer 306.

Figure 4A:
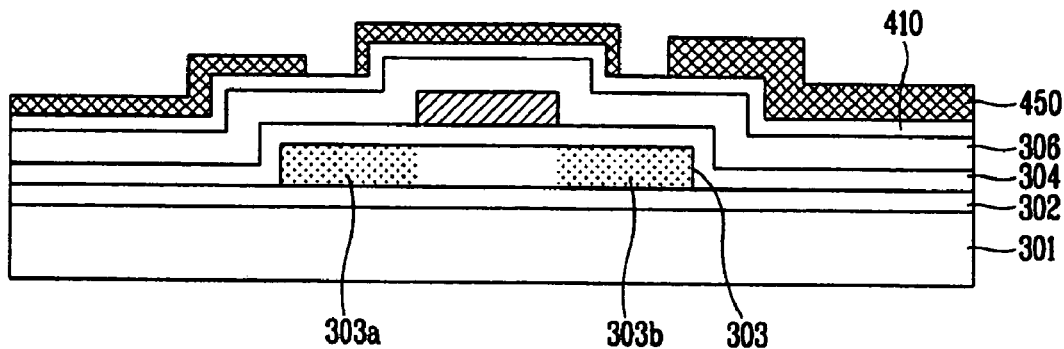
FIGS. 4A to 4E are views showing a fabrication process of a transreflective liquid crystal display device in accordance with the present invention.

Next, as shown in FIG. 4A, photoresist 450 is formed on the indium oxide layer, and diffractive exposure is performed on the photoresist 450 by using a diffractive mask. A thick layer of photoresist remains in a pixel region and is removed at a contact hole forming region. A thinner layer of photoresist remains in the non-pixel region, which includes the portion above the gate electrode.

FIG. 4A shows a photoresist pattern 450 formed by diffractive exposure. Contact holes are formed to expose the source and drain regions by using the photoresist pattern 450 as an etching mask. That is, by using the photoresist pattern 450 as a etching mask, the indium oxide layer 410, the second insulation layer 306 and the first insulation layer 304 on the source and drain regions are removed by wet-etching, thereby exposing the source and drain region of active layer 303.

The second insulation layer 306 is formed by deposition using a plasma including N₂ gas of about 1700 sccm to 2300 sccm, NH₃ gas of about 600 to 800 sccm and SiH4 gas of about 130 to 150 sccm under conditions of a voltage of 1500 to 1700 watt and pressure of about 1400 to 1600 mTorr. Particularly, a silicon nitride layer may be formed using a plasma including N₂ gas of about 2000 sccm, NH₃ gas of about 700 sccm and SiH4 gas of about 140 sccm under conditions of a voltage of about 1650 watt and pressure of about 1500 mTorr. The second insulation layer formed under such conditions has a porous structure, and so its wet-etching rate is the same as or faster than that of the first insulation layer. Accordingly, undercutting of the first insulation layer 304 can be prevented from occurring at an interface between the silicon nitride layer and the silicon oxide layer, thereby preventing generation of a stepped portion in the contact hole.

Figure 4B:
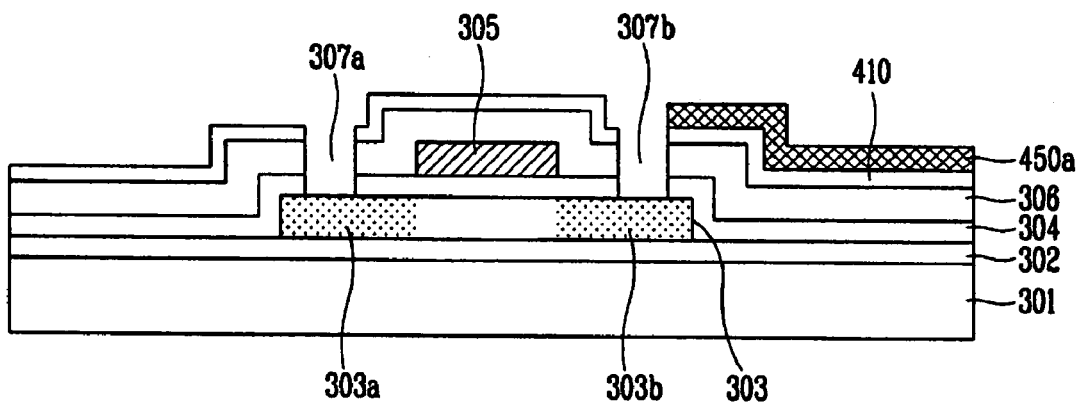

After the contact holes 307a and 307b are formed, the photoresist pattern 450 is partially removed through ashing. Ashing is a method for removing the photoresist 450 by oxidizing the photoresist using a gas that includes an oxygen active species. This permits the diffractively-exposed photoresist on the region except the pixel region to be completely removed. After ashing, parts of the indium oxide layer are exposed. FIG. 4B shows an exposed indium oxide layer above the gate electrode.

Figure 4C:
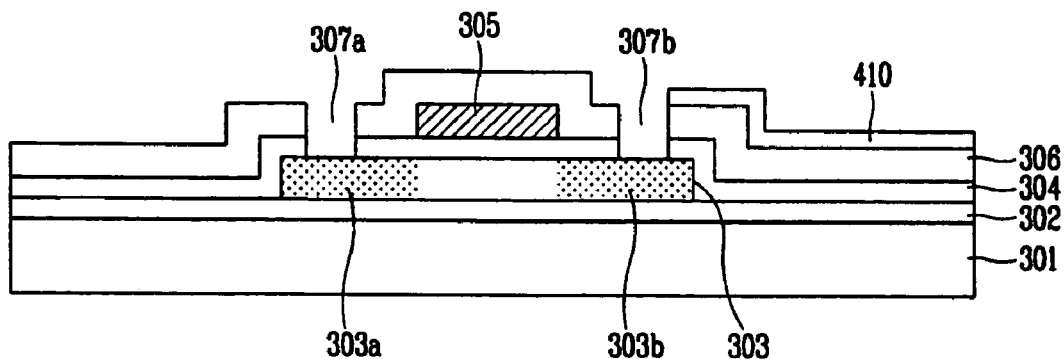

Next, as shown in FIG. 4C, the exposed indium oxide layer 410 is removed using the photoresist pattern 450a, which remains in the pixel region after ashing, as an etching mask. The photoresist pattern 450a above the pixel region is removed after etching, thus forming the pixel electrode.

Figure 4D:
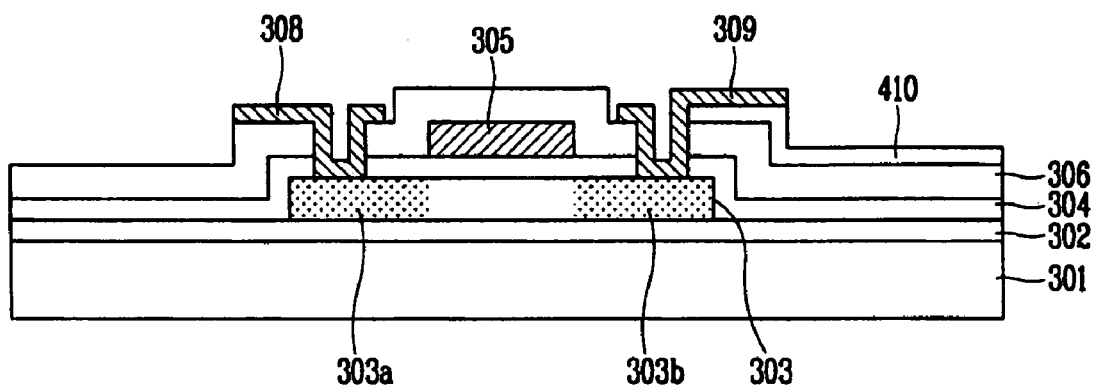

Next, as shown in FIG. 4D, a source and drain electrode are formed. That is, a conductive layer is formed in the contact holes 307a and 307b and on the pixel electrode 410 and patterned through a photolithographic process, to thereby form source and drain electrodes 308 and 309. The source electrode 308 is connected to the source region 303 through the contact hole 307a, and the drain electrode 309 is connected to the drain region 303 and also to the pixel electrode 410 through the contact hole 307b.

Figure 4E:
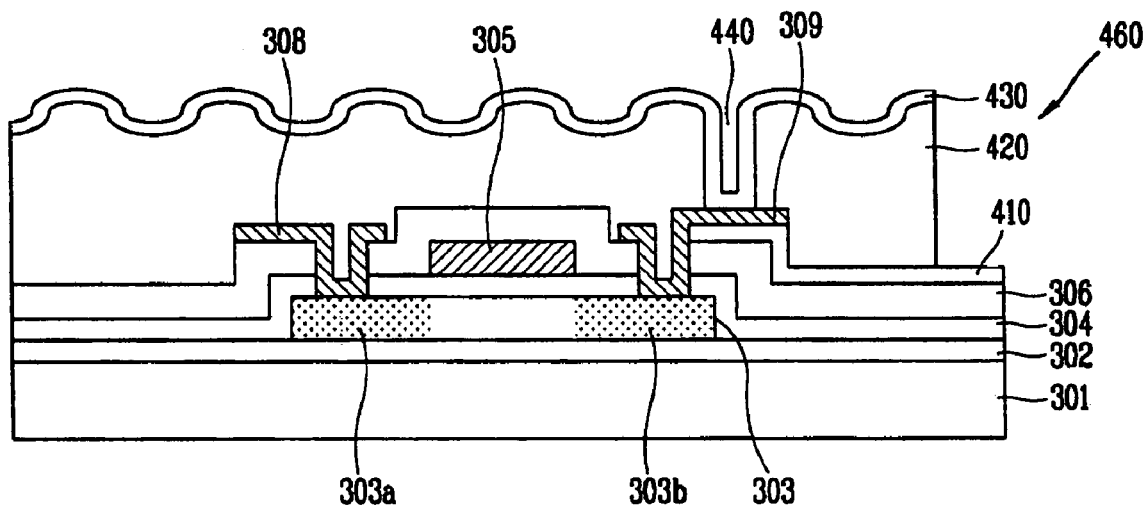

Then, as shown in FIG. 4E, an organic layer 420 containing BCB or photoacryl for example is applied over a reflective region, and a reflective electrode 430 containing a metal thin layer and connected to the drain electrode 303b is formed thereon. The reflective electrode 430 is connected to the drain electrode 303b through a contact hole 440 formed in the organic layer 420 over the drain electrode 303b and can receive a data voltage. The reflective electrode 430 operates as the pixel electrode in the reflective region of a unit pixel region, while the indium oxide layer 410 operates as the pixel electrode in a transparent region. The reflective electrode 430 in the reflective region and the indium oxide layer 410 operates in a transparent region drive a liquid crystal layer (not shown) thereabove.

Figure 5:
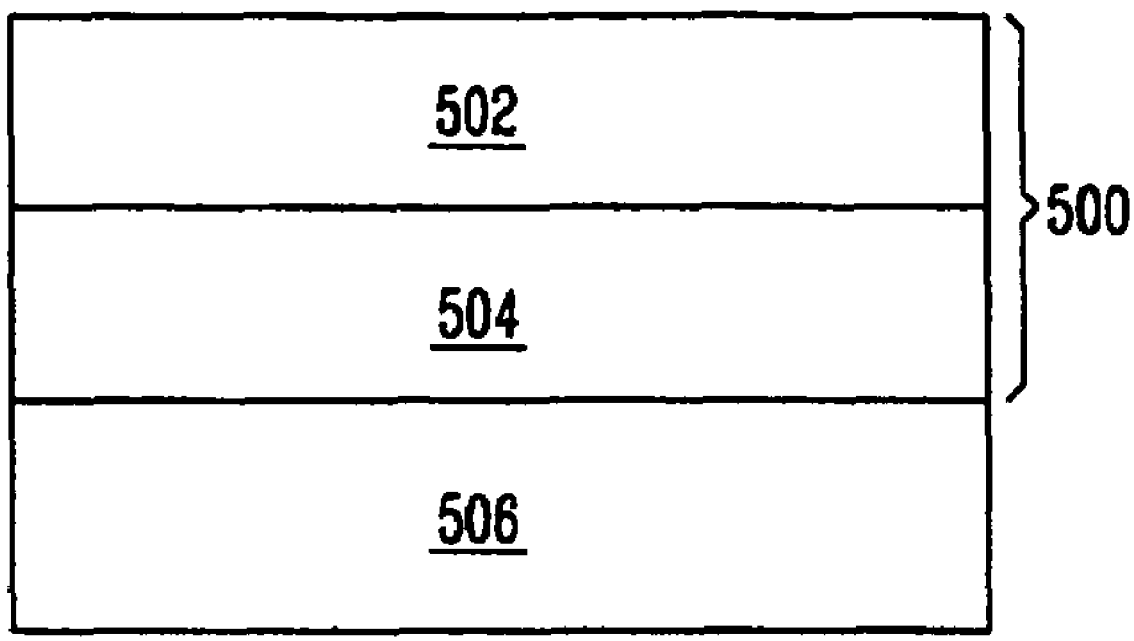
FIG. 5 is a sectional view showing a multiple layer structure used as the second insulating layer in either of the structures shown in FIG. 3F or 4E.

Although FIGS. 3 and 4 show the second insulating layer as one layer, as discussed above, the second insulating layer may be a multiple layer structure. As an example, FIG. 5 illustrates a portion of a second insulating layer 500 having a multiple layer structure (in this case a dual layer structure) on a first insulating layer 506. The second insulating layer 500 has a porous silicon nitride layer 502 and a silicon oxide layer 504. Although the porous silicon nitride layer 502 is shown as being more distal to the first insulating layer 506 than the silicon oxide layer 504, the porous silicon nitride layer 502 can be more proximate to the first insulating layer 506 than the silicon oxide layer 504.

As so far described, in forming a contact hole for connecting source and drain electrodes to source and drain regions, a contact hole without a stepped portion is formed to thereby prevent disconnection from occurring when a conductive layer is deposited in the contact hole. Accordingly, by preventing disconnection of a data line including a source electrode, line defects can be prevented. In addition, when the contact hole is formed, the second insulation layer and the first insulation layer are etched through the same wet-etching process so that the number of processes for forming a contact hole can be reduced.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A method for fabricating a transreflective liquid crystal display device, comprising:
    forming an active layer on a substrate;
    forming a first insulation layer including a silicon oxide layer on the active layer;
    forming a gate electrode on the first insulation layer;
    forming a second insulation layer including a porous silicon nitride layer on the gate electrode, the silicon nitride layer formed by deposition using a plasma including $N_2$ gas of about 1700 to 2300 sccm, $NH_3$ gas of about 600 to 800 sccm and $SiH_4$ gas of about 130 to 150 sccm under conditions of a voltage of about 1500 to 1700 V and pressure of about 1400 to 1600 mTorr;
    forming a transparent electrode layer including Indium Tin Oxide (ITO) on the second insulation layer;
    wet-etching the transparent electrode, the second insulation layer and the first insulation layer to form holes exposing the active layer;
    forming a pixel electrode by patterning the transparent electrode;
    forming a source electrode connected to the active layer through one of the holes and a drain electrode connected to the active layer and the pixel electrode through one of the holes;
    forming a passivation layer on the source and drain electrodes, and the second insulation layer;
    etching the passivation layer to form a hole exposing the drain electrode; and
    forming a reflective electrode connected to the drain electrode.

2. The method of claim 1, wherein forming the holes comprises:
    applying a photoresist layer to the transparent electrode layer;
    performing diffractive exposure on the photoresist layer such that a contact hole region in a pixel region is completely exposed, a pixel electrode region is not exposed and a remainder of the region on which the photoresist layer is applied is partially exposed; and
    simultaneously wet-etching the transparent electrode layer, the second insulation layer and the first insulating layer of the contact hole region.

3. The method of claim 2, wherein wet-etching the transparent electrode layer, the second insulation layer and the first insulation layer of the contact hole region is formed using a photoresist pattern formed by the diffractive exposure as an etching mask.

4. The method of claim 1, wherein forming the pixel electrode comprises:
    exposing a transparent electrode of a diffractive exposure region by ashing the diffractively-exposed photoresist layer; and
    removing the exposed transparent electrode.

* * * * *

UNITED STATES PATENT AND TRADEMARK OFFICE
CERTIFICATE OF CORRECTION

| | | |
|---|---|---|
| PATENT NO. | : 7,479,415 B2 | Page 1 of 1 |
| APPLICATION NO. | : 11/005646 | |
| DATED | : January 20, 2009 | |
| INVENTOR(S) | : Jeoung et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 872 days.

Signed and Sealed this
Third Day of May, 2011

David J. Kappos
*Director of the United States Patent and Trademark Office*